(12) United States Patent
Kim (10) Patent No.: US 9,098,136 B2
(45) Date of Patent: Aug. 4, 2015

(54) ORGANIC LIGHT EMITTING DISPLAY DEVICE

(71) Applicant: Samsung Display Co., Ltd., Yongin, Gyeonggi-Do (KR)

(72) Inventor: Young-Il Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 34 days.

(21) Appl. No.: 13/961,449

(22) Filed: Aug. 7, 2013

(65) Prior Publication Data

US 2014/0077186 A1   Mar. 20, 2014

(30) Foreign Application Priority Data

Sep. 18, 2012  (KR) .................. 10-2012-0103587

(51) Int. Cl.
*G06F 3/041* (2006.01)
*H01L 51/52* (2006.01)
*H01L 27/32* (2006.01)

(52) U.S. Cl.
CPC .......... *G06F 3/0412* (2013.01); *H01L 27/3218* (2013.01); *H01L 51/52* (2013.01); *H01L 27/323* (2013.01); *H01L 27/3211* (2013.01); *H01L 27/3216* (2013.01); *H01L 27/3244* (2013.01)

(58) Field of Classification Search
CPC ............ H01L 27/3211; H01L 27/3216; H01L 27/2318; H01L 51/52; H01L 27/323

USPC .............. 385/120, 115, 116, 39, 49; 345/695, 345/697, 694

See application file for complete search history.

(56) References Cited

U.S. PATENT DOCUMENTS

| | | | |
|---|---|---|---|
| 2004/0017985 A1* | 1/2004 | Cok et al. ...................... | 385/120 |
| 2005/0170735 A1* | 8/2005 | Strip ............................... | 445/24 |
| 2006/0274090 A1* | 12/2006 | Koyama et al. ................ | 345/695 |
| 2009/0195144 A1* | 8/2009 | Kitabayashi .................. | 313/503 |
| 2010/0033084 A1* | 2/2010 | Ko et al. ....................... | 313/504 |
| 2010/0238572 A1* | 9/2010 | Tao et al. ...................... | 359/849 |
| 2011/0050645 A1* | 3/2011 | Lee et al. ...................... | 345/175 |
| 2011/0102365 A1* | 5/2011 | Park et al. ..................... | 345/174 |
| 2012/0056531 A1* | 3/2012 | Park et al. ..................... | 313/506 |
| 2013/0037827 A1* | 2/2013 | Levermore et al. ............ | 257/88 |
| 2013/0234917 A1* | 9/2013 | Lee ................................ | 345/82 |
| 2014/0071030 A1* | 3/2014 | Lee ................................ | 345/82 |

FOREIGN PATENT DOCUMENTS

| | | |
|---|---|---|
| JP | 2006-309182 A | 11/2006 |
| JP | 2007-288294 A | 11/2007 |
| KR | 10-2011-0024530 A | 3/2001 |

* cited by examiner

*Primary Examiner* — Michael Lebentritt
*Assistant Examiner* — Jordan Klein
(74) *Attorney, Agent, or Firm* — Knobbe Martens Olson & Bear, LLP (57) ABSTRACT

An organic light emitting diode (OLED) display device includes a substrate, a pixel unit formed over the substrate and including a plurality of sub-pixels, and a non-pixel unit immediately neighboring the pixel unit. The pixel unit has an octagonal shape.

16 Claims, 8 Drawing Sheets

ORGANIC LIGHT EMITTING DISPLAY DEVICE

RELATED APPLICATIONS

This application claims priority to and the benefit of Korean Patent Application No. 10-2012-0103587 filed in the Korean Intellectual Property Office on Sep. 18, 2012, the entire contents of which are incorporated herein by reference.

BACKGROUND

1. Field

The described technology relates generally to an organic light emitting diode (OLED) display.

2. Description of the Related Technology

Recently, display devices have been developed to have various functions in addition to a simple display function. For example, there are transparent displays and a touch sensor displays. For such multifunctional display devices, thin and flexible organic light emitting diode (OLED) displays can be used.

Pixels of the organic light emitting diode (OLED) display have the same shape and size and are arranged with a stripe pattern of quadrangles. In such pixel arrangement, extra rooms or areas for a specific functional configuration, for example, a touch sensor etc. may be needed in addition to regions where the pixels for the light emitting are disposed. In this case, it is difficult to efficiently arrange the pixels along with the other functional configuration.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides an organic light emitting diode (OLED) display easily realizing a functional region between pixels while simultaneously having excellent resolution.

An organic light emitting diode (OLED) display device according to an exemplary embodiment includes a substrate, a pixel unit formed over the substrate and including a plurality of sub-pixels, and a non-pixel unit immediately neighboring the pixel unit, wherein the pixel unit has an octagonal shape.

The pixel unit may have an equilateral octagonal shape.

The plurality of sub-pixels may include a first sub-pixel configured to emit red light, a second sub-pixel configured to emit green light, and a third sub-pixel configured to emit blue light.

The device may include additional pixel units and additional non-pixel units formed over the substrate, and a first one of the non-pixel units may immediately neighbor some of the pixel units and is surrounded by the immediately neighboring pixel units.

A first one of the pixel units may include a first edge and a second edge next to the first edge, wherein the first edge contacts one of the non-pixel units and the second edge contacts one of the other pixel units.

The first edge may be longer than the second edge.

The first non-pixel unit may have a square shape.

Each edge of the first non-pixel unit contact one of four immediately neighboring pixel units.

The plurality of sub-pixels of the pixel units are arranged to collectively form a stripe pattern which comprises bands of the sub-pixels parallel to one edge of the square.

The plurality of sub-pixels of the pixel units are arranged to collectively form a stripe pattern which comprises bands of the sub-pixels inclined with respect to one of the four edges of the square shape by an angle of about 45 degrees.

The plurality of sub-pixels of each pixel unit may include a first sub-pixel, a second sub-pixel and a third sub-pixel, the first sub-pixels of some of the pixel units may be arranged to form a continuous band of the stripe pattern.

The non-pixel unit may include a light transmission portion from which light is transmitted.

The non-pixel unit may include a touch sensor portion.

The non-pixel unit may include a white light emitting portion.

According to embodiments of the present invention, an organic light emitting diode (OLED) display realizing excellent resolution and simultaneously realizing the functional region within or between the pixels may be provided.

BRIEF DESCRIPTION OF THE DRAWINGS

FIG. 6A to FIG. 6C are top plan views of an organic light emitting diode (OLED) display according to the third exemplary embodiment and variations thereof.

DETAILED DESCRIPTION

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
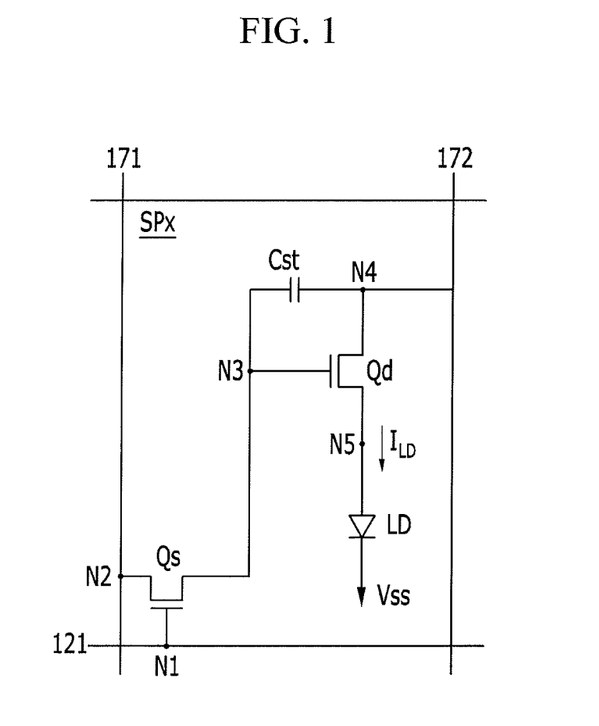
FIG. 1 is an equivalent circuit of one sub-pixel of an organic light emitting diode (OLED) display according to the first exemplary embodiment.

FIG. 1 is an equivalent circuit of one sub-pixel of an organic light emitting diode (OLED) display according to the first exemplary embodiment.

As shown in FIG. 1, an organic light emitting diode (OLED) display according to the present exemplary embodiment includes a plurality of signal lines 121, 171, and 172, and a plurality of sub-pixels SPX connected thereto. The sub-pixel SPX may be one of a first sub-pixel, a second sub-pixel, and a third sub-pixel, and the first sub-pixel, the second sub-pixel, and the third sub-pixel may be a red sub-pixel (R), a green sub-pixel (G), and a blue sub-pixel (B).

The signal lines include a plurality of gate signal lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 extend substantially in a column direction and substantially parallel to each other. The driving voltage lines 172 extend substantially in a column direction and substantially parallel to each other, however they may extend in the row direction or the column direction, and may form a mesh shape. Also, they may be appropriately formed to pass an opening circumference of the sub-pixel SPX according to a shape of the sub-pixel SPX.

The sub-pixel SPX includes a switching transistor Qs, a driving transistor Qd, a storage capacitor Cst, and an organic light emitting element LD.

The switching transistor Qs has a control terminal N1, an input terminal N2, and an output terminal N3, and the control terminal N1 is connected to the scan signal line 121, the input terminal N2 is connected to the data line 171, and the output terminal N3 is connected to the driving transistor Qd. The switching transistor Qs responds to the scan signal received from the scan signal line 121 to transfer the data signal received from the data line 171 to the driving transistor Qd.

The driving transistor Qd has a control terminal N3, an input terminal N4, and an output terminal N5, and the control terminal N3 is connected to the switching transistor Qs, the input terminal N4 is connected to the driving voltage line 172, and the output terminal N5 is connected to the organic light emitting element LD. The driving transistor Qd allows the output current ILD having a magnitude that varies according to a voltage applied between the control terminal N3 and output terminal N5 to flow therethrough.

The capacitor Cst is connected between the control terminal N3 and the input terminal N4 of the driving transistor Qd. This capacitor Cst charges the data signal applied to the control terminal N3 of the driving transistor Qd and maintains the data signal even after the switching transistor Qs is turned off.

The organic light emitting element LD is, for example, an organic light emitting diode (OLED), and has an anode connected to the output terminal N5 of the driving transistor Qd and a cathode connected to a common voltage Vss. The organic light emitting element LD displays an image by emitting light while the intensity thereof is changed according to the output current ILD of the driving transistor Qd. The organic light emitting element LD may include an organic material intrinsically emitting any one or at least one light of primary colors such as three primary colors of red, green, and blue, and the organic light emitting diode display displays a desired image by a spatial sum of the colors.

The switching transistor Qs and the driving transistor Qd are n-channel field effect transistors (FET), but at least one of the transistors may be a p-channel field effect transistor. Further, the connection relation of the transistors Qs and Qd, the capacitor Cst, and the organic light emitting element LD may be changed.

The structure of the organic light emitting diode display according to the first exemplary embodiment will be described in detail with reference to FIG. 2 together with FIG. 1.

Figure 2:
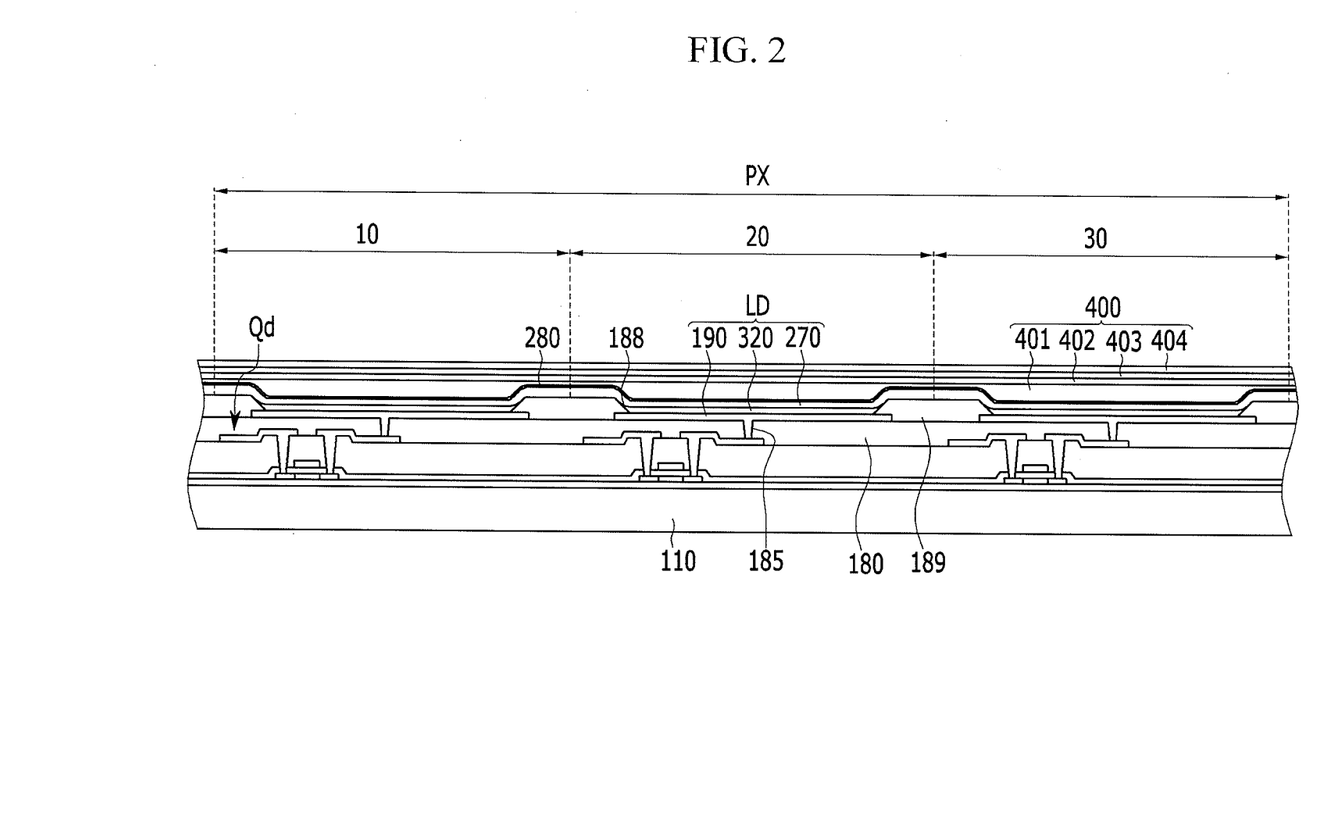
FIG. 2 is a cross-sectional view of a pixel unit of an organic light emitting diode (OLED) display according to the first exemplary embodiment.

FIG. 2 is a cross-sectional view of a pixel unit (PX) of an organic light emitting diode (OLED) display according to the first exemplary embodiment.

As shown in FIG. 2, the pixel unit PX may include a first sub-pixel 10, a second sub-pixel 20, and a third sub-pixel 30.

The driving transistor Qd is formed on an insulating substrate 110 that may be made of transparent glass or plastic. In addition to this, a plurality of signal lines (not shown), a plurality of switching transistors (not shown), and the like may be further formed on the insulating substrate 110.

A protective layer 180 that may be made of an inorganic or organic material is formed on the driving transistor Qd. In the case where the protective layer 180 is made of the organic material, a surface thereof may be flat. A contact hole 185 through which a portion of the driving transistor Qd is exposed is formed in the protective layer 180. A pixel electrode 190 is formed on the protective layer 180. The pixel electrode 190 may include a reflective electrode and a transparent electrode formed thereon. The reflective electrode may be made of metal having high reflectance, such as silver (Ag) or aluminum (Al), an alloy thereof, or the like, and the transparent electrode may be made of a transparent conductive oxide such as ITO (indium tin oxide) or IZO (indium zinc oxide).

A pixel definition layer 189 covering a circumference of an edge of the pixel electrode 190 is formed on the protective layer 180. The pixel definition layer 189 has openings 188 formed with different widths according to an aperture ratio of each sub-pixel 10, 20, and 30.

An organic emission layer 320 is formed on the pixel electrode 190, and the common electrode 270 is formed on the organic emission layer 320 and the pixel definition layer 189.

The organic emission layer 320 may further include organic layers (not shown) for efficiently transferring carriers of holes or electrons to the emission layer in addition to an emission layer (not shown) emitting light in practice. The organic layers may be a hole injection layer (HIL) and a hole transport layer (HTL) positioned between the pixel electrode 190 and the emission layer, and an electron injection layer (EIL) and an electron transport layer (ETL) positioned between the common electrode 270 and the emission layer.

A cover layer 280 covering the common electrode 270 to protect the common electrode 270 may be formed of the organic layer on the common electrode 270.

Further, a thin film encapsulation layer 400 is formed on the cover layer 280. The thin film encapsulation layer 400 seals and protects the organic light emitting element LD and a driving circuit portion formed on the substrate 110 from the outside. The thin film encapsulation layer 400 includes encapsulation inorganic layers 402 and 404 and encapsulation organic layers 401 and 403 alternately laminated one by one. FIG. 2 shows a case where the two encapsulation inorganic layers 402 and 404 and two encapsulation organic layers 401 and 403 are alternately laminated one by one to constitute the thin film encapsulation layer 400 as an example, but is not limited thereto.

Figure 3:
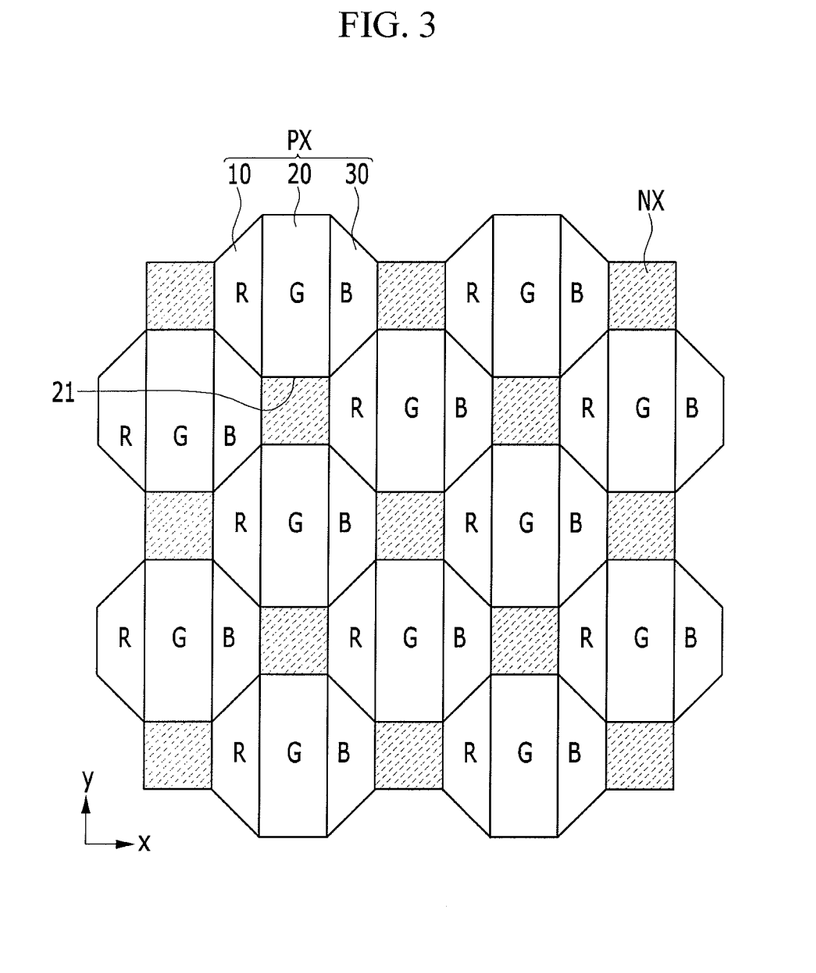
FIG. 3 is a top plan view of an organic light emitting diode (OLED) display according to the first exemplary embodiment.

Next, an arrangement of a pixel unit (PX) and a non-pixel unit (NX) of an organic light emitting diode (OLED) display device according to the first exemplary embodiment will be described with reference to FIG. 3. FIG. 3 is a top plan view of an organic light emitting diode (OLED) display according to the first exemplary embodiment.

As shown in FIG. 3, the pixel unit (PX) formed over a major surface of the substrate 110 includes the first sub-pixel 10, the second sub-pixel 20, and the third sub-pixel 30. The first sub-pixel 10 emits the first color light, the second sub-pixel 20 emits the second color light, and the third sub-pixel 30 emits the third color light. The first color, the second color, and the third color may respectively be red, blue, and green, wherein the first pixel 10 may be a red pixel (R), the second pixel 20 may be a blue pixel (B), and the third pixel 30 may be a green pixel (G), however it is not limited thereto, and the first pixel 10 or the third pixel 30 may be a green pixel (G).

Also, each pixel unit (PX) including the first sub-pixel 10, the second sub-pixel 20, and the third sub-pixel 30 has an octagonal shape when viewed in a viewing direction perpendicular to the major surface of the substrate 110. In the present exemplary embodiment, the pixel unit (PX) has an equilateral octagonal shape, however it is not limited thereto. In the pixel unit (PX) of the octagonal shape in accordance with the illustrated embodiment, the first sub-pixel 10, the second sub-pixel 20, and the third sub-pixel 30 are sequentially arranged with a stripe or band shape. For example, the second sub-pixel 20 is disposed with the rectangular shape in a center of the octagonal shape of the pixel unit (PX), and the first and third sub-pixels 10 and 30 are disposed to be symmetrical to each other with respect to the second sub-pixel 20 at right and left sides thereof.

In embodiments, a non-pixel unit (NX) is disposed between a plurality of pixel units (PX). In the illustrated embodiment, a plurality of pixel units (PX) are repeatedly disposed on the substrate to form a pixel array. As shown, the device include a plurality of regions of a square shape, and each region is surrounded by four different pixel units (PX) when viewed in the viewing direction. In each region, the non-pixel unit (NX) may be formed. The non-pixel unit (NX) or the region may be used as a light transmission portion, a touch sensor portion, or a white light emitting portion.

Each pixel unit (PX) of the octagonal shape have eight edges which contact the neighboring pixel units (PX) and the neighboring non-pixel units (NX) which are alternately arranged around the pixel unit. That is, referring to the pixel unit (PX) of FIG. 3, a short edge 21 of the second sub-pixel 20 of the rectangular shape contacts the non-pixel unit (NX), and the edges that are next to the short edge 21 contact the pixel units (PX). Resultantly, one pixel unit (PX) is surrounded by four pixel units (PX) and four non-pixel units (NX). In this specification, "two edges contact each other" means that one edge included in one shape is shared with another shape, and this is equally applied hereafter. Also, the present exemplary embodiment is described with reference to the short edge 21 of the second sub-pixel 20, however it is not limited thereto, and it may also be equally applied with reference to any one edge of the octagonal shape of the pixel unit (PX).

In the present exemplary embodiment, the stripe shape of the first sub-pixel 10, the second sub-pixel 20, and the third sub-pixel 30 of the pixel unit (PX) is formed in parallel to one edge of the non-pixel unit (NX). In FIG. 3, when two edges of the square shaped non-pixel unit (NX) that are perpendicular to each other are parallel to an x direction and a y direction shown in FIG. 3, the stripe shape of the first sub-pixel 10, the second sub-pixel 20, and the third sub-pixel 30 is formed in parallel to the y direction.

As described above, the pixel unit (PX) that does not have a conventional quadrangle shape but has the octagonal shape may obtain a further higher resolution. On a characteristic of the quadrangular and the octagonal shape, when providing the same circumference, an area of the octagonal shape is larger.

Figure 4:
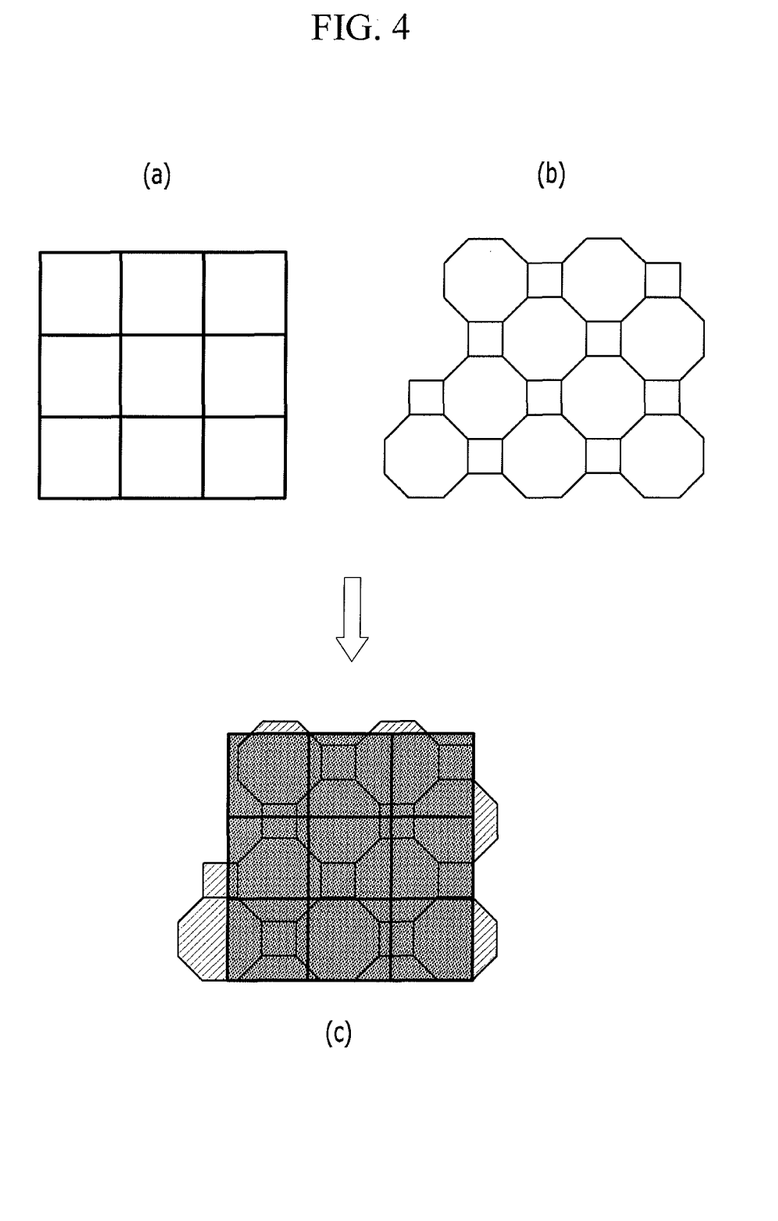
FIG. 4 is a view of the first exemplary embodiment and a comparative example.

Next, an effect of embodiments of the present invention will be described with reference to FIG. 4. FIG. 4 is a view of the first exemplary embodiment and a comparative example. In FIG. 4, (a) and (b) show a quadrangular pixel structure and an octagonal pixel structure having the same area, and (c) shows (a) and (b) overlapping each other. As shown in (c), the conventional quadrangular structure and the octagonal structure of the present exemplary embodiment equally include nine pixels in the same area. At this time, in each pixel structure of (a) and (b), a distance between the pixels is measured and a ppi (pixels per inch) value is calculated therefrom. A result thereof is shown in Table 1.

TABLE 1

| | Comparative Example (a) | Exemplary Embodiment (b) |
|---|---|---|
| Shortest distance between pixels | 102 μm | 100.19 μm |
| Longest distance between pixels | 114.25 μm | 141.69 μm |
| ppi value | 249 ppi | 253 ppi |

As shown in Table 1, for the pixel structure of the same area, the ppi value of the exemplary embodiment is larger than the ppi value of the comparative example. As the ppi value is increased, the resolution is higher, and according to the exemplary embodiment from the above result, the high resolution may be realized.

Also, according to an exemplary embodiment, to realize the non-pixel unit (NX) having various functions, without formation of a separated region, a space between the plurality of pixel units (PX) may be used such that the entire area may be efficiently used in the display device.

Next, an arrangement of the pixel unit PX2 and the non-pixel unit NX2 of an organic light emitting diode (OLED) display according to the second exemplary embodiment will be described with reference to FIG. 5. In the second exemplary embodiment, for better comprehension and ease of description, constituent elements identical to or corresponding to those according to the first exemplary embodiment are denoted by the same reference numerals.

Figure 5:
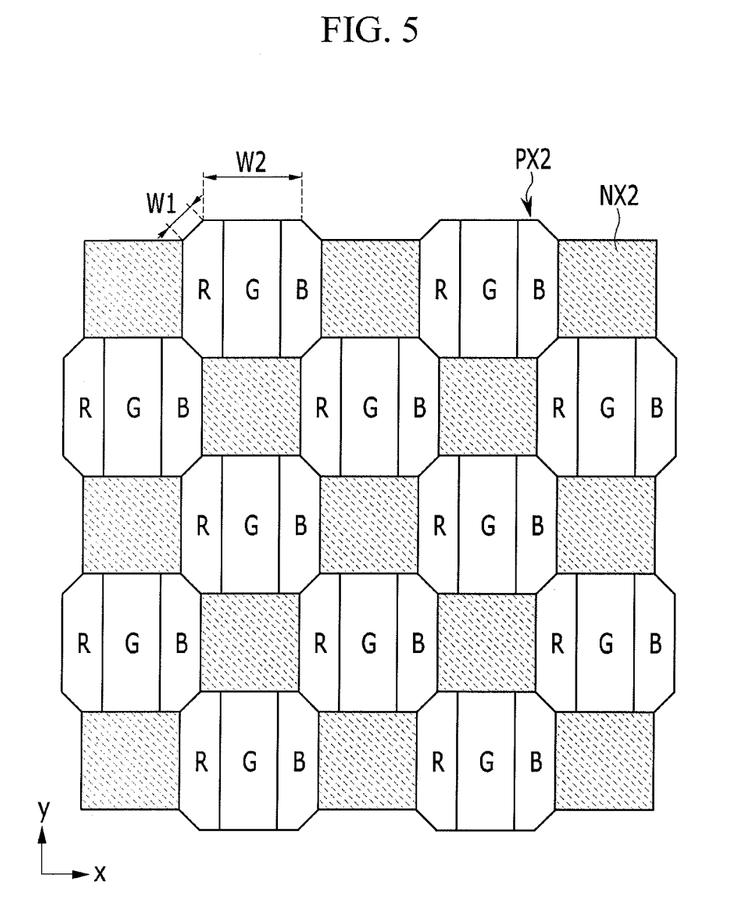
FIG. 5 is a top plan view of an organic light emitting diode (OLED) display according to the second exemplary embodiment.

FIG. 5 is a top plan view of an organic light emitting diode (OLED) display according to the second exemplary embodiment. As shown in FIG. 5, while two opposing edges have the same length, the pixel unit PX2 has the octagonal shape in which long edges and short edges are alternately arranged. In the present exemplary embodiment, one edge of the pixel unit PX2 contacting one edge of the non-pixel unit NX2 is shorter than another edge contacting one edge of another neighboring pixel unit PX2. According to this configuration, compared with the first exemplary embodiment, the area of the non-pixel unit NX2 may be widened. That is, for the pixel unit PX2, by adjusting a ratio (W1/W2) of a length W1 of the edge contacting the neighboring pixel unit PX2 and a length W2 of the edge of the neighboring non-pixel unit NX2, the area of the non-pixel unit NX2 may be easily adjusted. As the value of W1/W2 is increased, the area of the non-pixel unit NX2 is decreased, and as the value of W1/W2 is decreased, the area of the non-pixel unit NX2 is increased.

According to the second exemplary embodiment, the region ratio of the non-pixel unit NX2 may be easily adjusted. Accordingly, by considering a function of the non-pixel unit NX2 or usage of the display device, the area of the non-pixel unit NX2 may be appropriately selected as necessary.

Next, the arrangement of the pixel unit PX3 and the non-pixel unit NX3 of the organic light emitting diode (OLED) display according to the third exemplary embodiment will be described with reference to FIG. 6A to FIG. 6C. In the third exemplary embodiment, for better comprehension and ease of description, constituent elements identical to or corresponding to those according to the first exemplary embodiment are denoted by the same reference numerals.

Figure 6A:
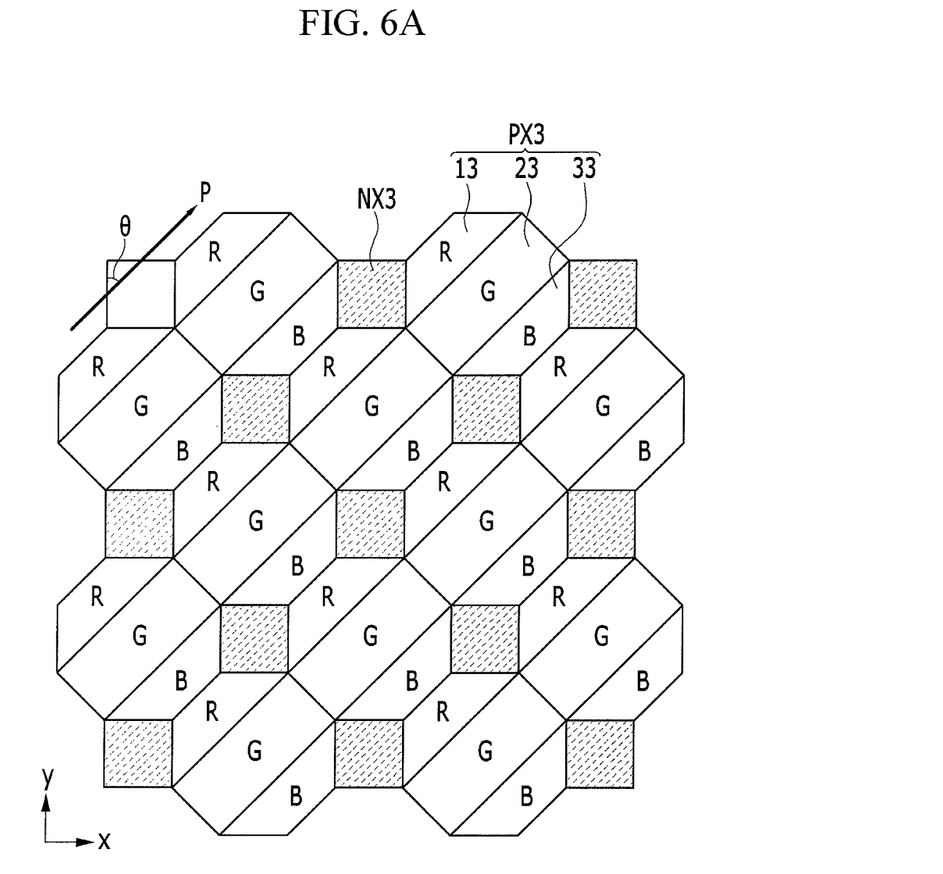
Figure 6B:
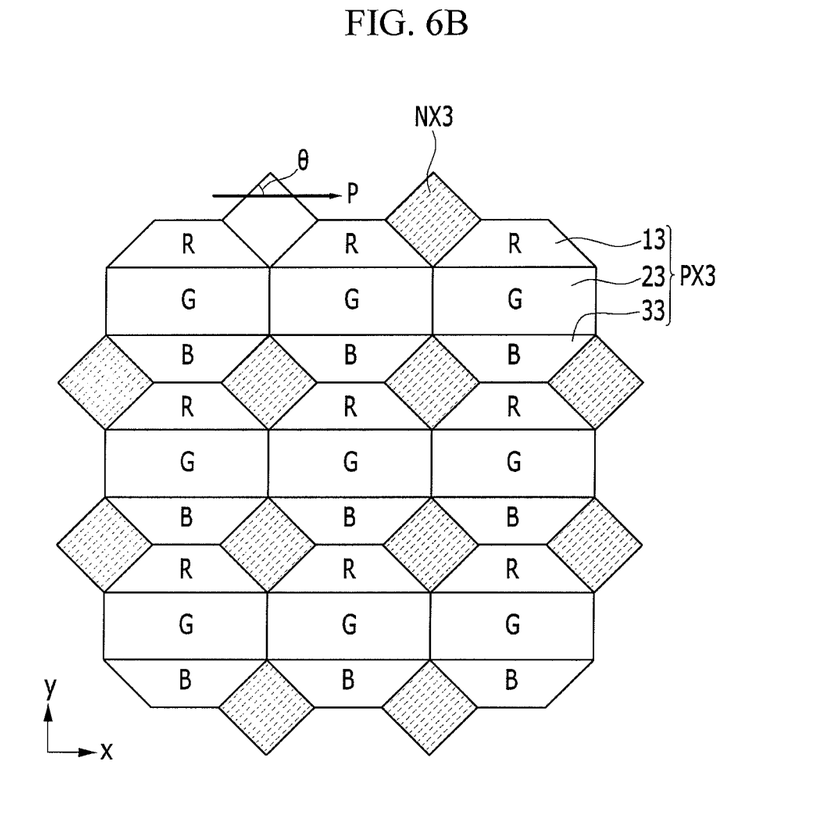
Figure 6C:
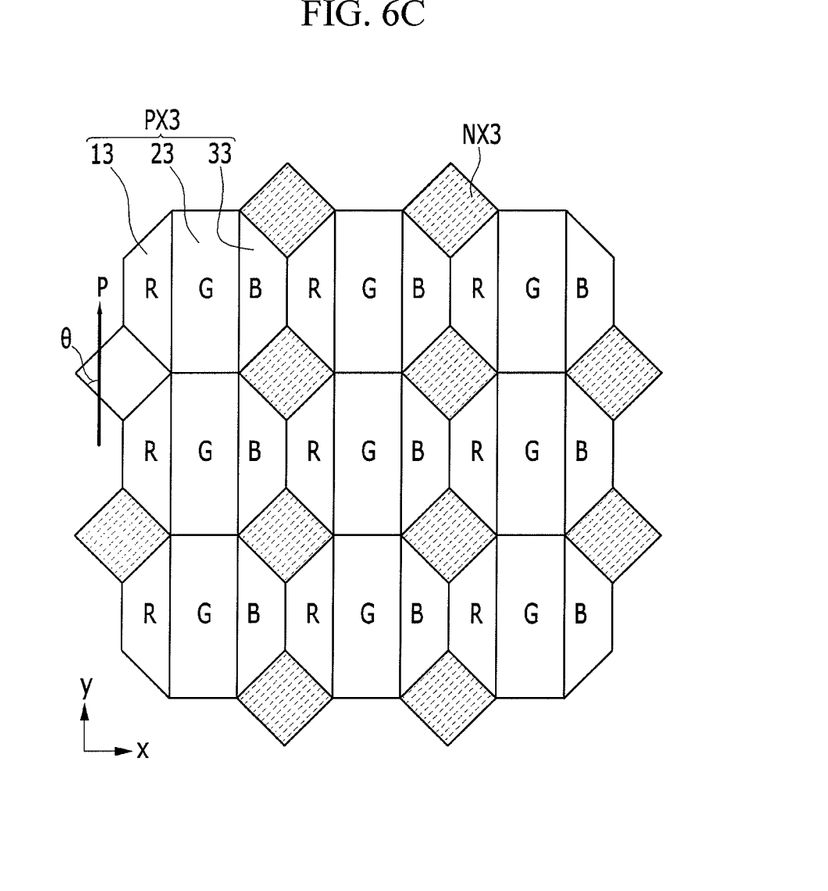

FIG. 6A to FIG. 6C are top plan views of an organic light emitting diode (OLED) display according to the third exemplary embodiment and variations thereof.

As shown in FIG. 6A to FIG. 6C, the pixel unit PX3 includes the first sub-pixel 13, the second sub-pixel 23, and the third sub-pixel 33. The first to third sub-pixel 13, 23, and 33 are disposed with the stripe or band shape. A direction P in which the stripe shape is arranged forms an angle of about 45 degrees with one edge of the non-pixel unit NX3. That is, for FIG. 6A to FIG. 6C, the magnitude of the angle is about 45 degrees. Also, for the sub-pixels 13, 23, and 33 included in a plurality of pixel units PX3, the sub-pixels 13, 23, and 33 displaying the same color are positioned on the same line. For example, for one pixel unit PX3, the red sub-pixel (R) of the first sub-pixel 13 is formed on the same line as the other red sub-pixel (R) in the neighboring pixel unit PX3. Similarly, the green sub-pixel (G) is formed on the same line as the other green sub-pixel (G) of the neighboring pixel unit PX3, and the blue sub-pixel (B) is formed on the same line as the other blue sub-pixel (B) of the neighboring pixel unit PX3.

If the sub-pixels 13, 23, and 33 displaying the same color are formed on the same line, the arrangement direction of the stripe shape in which the sub-pixels 13, 23, and 33 are formed is not limited. For example, as shown in FIG. 6A, the arrangement direction may form an angle of about 45 degrees with the x-axis direction of the substrate, as shown in FIG. 6B, the arrangement direction may be parallel to the x-axis direction of the substrate, and as shown in FIG. 6C, the arrangement direction may be parallel to the y-axis direction of the substrate. However, it is not limited thereof, and the direction of the stripe shape may be appropriately changed if necessary.

According to the third exemplary embodiment, a printing process to form the pixel unit may be easily performed. That is, to perform the printing process of spraying a solution to form the organic emission layer through a nozzle, it is necessary to arrange the pixels of the same color on the same line, and according to the structure like the third exemplary embodiment, it is possible to arrange the sub-pixels of the same color on the same line. Particularly, the sub-pixels 13, 23, and 33 may be arranged in any direction such as a diagonal direction, a horizontal direction (the x-axis direction), and a vertical direction (the y-axis direction) of the substrate such that the performance of the printing process is possible without the limitation of direction.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of Symbols> | |
|---|---|
| pixel unit (PX, PX2, PX3) | non-pixel unit (NX, NX2, NX3) |
| first sub-pixel 10 and 13 | second sub-pixel 20 and 23 |
| third sub-pixel 30 and 33 | |

What is claimed is:

1. An organic light emitting diode (OLED) display device comprising:
   a substrate comprising a major surface;
   a plurality of pixel units formed over the substrate, each pixel unit comprising a plurality of sub-pixels; and
   a non-pixel unit surrounded by four of the plurality of pixel units when viewed in a direction perpendicular to the major surface,
   wherein the plurality of sub-pixels in each pixel unit form an octagonal shape when viewed in the direction,
   wherein the plurality of sub-pixels in each pixel unit comprise a first sub-pixel configured to emit light having a first color, a second sub-pixel configured to emit light having a second color which is different from the first color, and a third sub-pixel configured to emit light having a third color which is different from the first and second colors, wherein the second sub-pixel is interposed between the first and third sub-pixels when viewed in the direction,
   wherein one edge of the first sub-pixel of each pixel unit opposes one edge of the third sub-pixel of an immediately neighboring pixel unit.

2. The organic light emitting diode (OLED) display device of claim 1, wherein the first color is red, the second color is green, and the third color is sub blue.

3. The organic light emitting diode (OLED) display device of claim 1, wherein a first one of the pixel units comprises a first edge and a second edge next to the first edge, wherein the first edge opposes one edge of the non-pixel unit and the second edge opposes one edge of an immediately neighboring pixel unit.

4. The organic light emitting diode (OLED) display device of claim 3, wherein the first edge is longer than the second edge.

5. The organic light emitting diode (OLED) display device of claim 1, wherein the non-pixel unit comprises four edges, each of which opposes an edge of one of the four surrounding pixel units.

6. The organic light emitting diode (OLED) display device of claim 5, wherein the plurality of sub-pixels of the pixel units are arranged to collectively form a stripe pattern which comprises bands of the sub-pixels parallel to one of the four edges of the non-pixel unit.

7. The organic light emitting diode (OLED) display device of claim 5, wherein the plurality of sub-pixels of the pixel units are arranged to collectively form a stripe pattern which comprises bands of the sub-pixels inclined with respect to one of the four edges of the non-pixel unit by an angle of about 45 degrees.

8. The organic light emitting diode (OLED) display device of claim 7,
   wherein the second sub-pixels of some of the pixel units are arranged to form a band of the stripe pattern.

9. The organic light emitting diode (OLED) display device of claim 1, wherein the non-pixel unit comprises a light transmission portion through which light is transmitted.

10. The organic light emitting diode (OLED) display device of claim 1, wherein the non-pixel unit comprises a touch sensor portion.

11. The organic light emitting diode (OLED) display device of claim 1, wherein the non-pixel unit comprises a white light emitting portion.

12. The organic light emitting diode (OLED) display device of claim 1, wherein the second sub-pixel is in a rectangular shape when viewed in the direction.

13. The organic light emitting diode (OLED) display device of claim 12, wherein the first sub-pixel is in a trapezoidal shape when viewed in the direction.

14. The organic light emitting diode (OLED) display device of claim 12, wherein the first sub-pixel is in a polygonal shape when viewed in the direction.

15. The organic light emitting diode (OLED) display device of claim 12, wherein one edge of the second sub-pixel of each pixel unit opposes one edge of the second sub-pixel of an immediately neighboring pixel unit.

16. The organic light emitting diode (OLED) display device of claim 12, wherein one edge of the second sub-pixel of one of the pixel units opposes a first edge of a non-pixel unit, wherein a second edge of the non-pixel unit opposing the first edge thereof opposes one edge of the second sub-pixel of another pixel unit immediately neighboring the non-pixel unit.

* * * * *